United States Patent
Mineyama et al.

(10) Patent No.: US 8,461,926 B2
(45) Date of Patent: Jun. 11, 2013

(54) DIFFERENTIAL AMPLIFIER CIRCUIT

(75) Inventors: Akiko Mineyama, Kawasaki (JP);
Yoichi Kawano, Kawasaki (JP);
Toshihide Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 19 days.

(21) Appl. No.: 13/309,687

(22) Filed: Dec. 2, 2011

(65) Prior Publication Data
US 2012/0139632 A1  Jun. 7, 2012

(30) Foreign Application Priority Data
Dec. 3, 2010  (JP) .................. 2010-270747

(51) Int. Cl.
*H03F 3/45* (2006.01)
(52) U.S. Cl.
USPC .............. 330/253; 330/291; 330/260
(58) Field of Classification Search
USPC .............. 330/252–261, 291, 282, 86
See application file for complete search history.

(56) References Cited

U.S. PATENT DOCUMENTS

| 7,256,646 B2 * | 8/2007 | Eid et al. .................. 327/563 |
| 7,692,494 B2 | 4/2010 | Ogino et al. |
| 7,750,740 B2 | 7/2010 | Inoue |
| 8,344,805 B2 * | 1/2013 | Wang et al. .................. 330/260 |

FOREIGN PATENT DOCUMENTS

| JP | 2008-147730 | 6/2008 |
| WO | WO-2007/096940 | 8/2007 |

* cited by examiner

*Primary Examiner* — Hieu Nguyen
(74) *Attorney, Agent, or Firm* — Fujitsu Patent Center (57) ABSTRACT

A differential amplifier circuit includes a first/second field effect transistor including a gate coupled to a first/second differential input signal terminal, a source coupled to a reference potential node, and a drain coupled to a first/second differential output signal terminal, a first variable capacitor coupled between the gate of the first field effect transistor and the drain of the second field effect transistor, a second variable capacitor coupled between the gate of the second field effect transistor and the drain of the first field effect transistor, and a first envelope detector configured to detect an envelope of a signal at the first differential output signal terminal or the second differential output signal terminal, the first variable capacitor and/or the second variable capacitor has a capacitance that varies in accordance with an envelope detected by the first envelope detector.

8 Claims, 12 Drawing Sheets

DIFFERENTIAL AMPLIFIER CIRCUIT

CROSS-REFERENCE TO RELATED APPLICATIONS

This application is based upon and claims the benefit of priority from the prior Japanese Patent Application No. 2010-270747 filed on Dec. 3, 2010, the entire contents of which are incorporated herein by reference.

FIELD

The present invention relates to differential amplifier circuits.

BACKGROUND

Figure 1A:
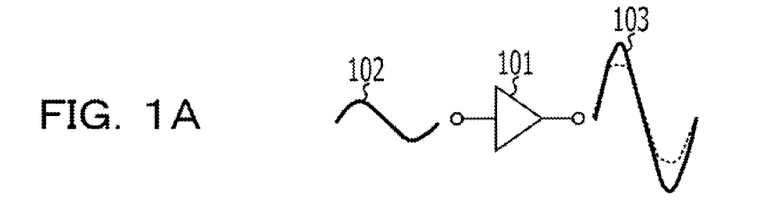
FIGS. 1A to 1C illustrate an amplifier circuit and its characteristics.
Figure 1B:
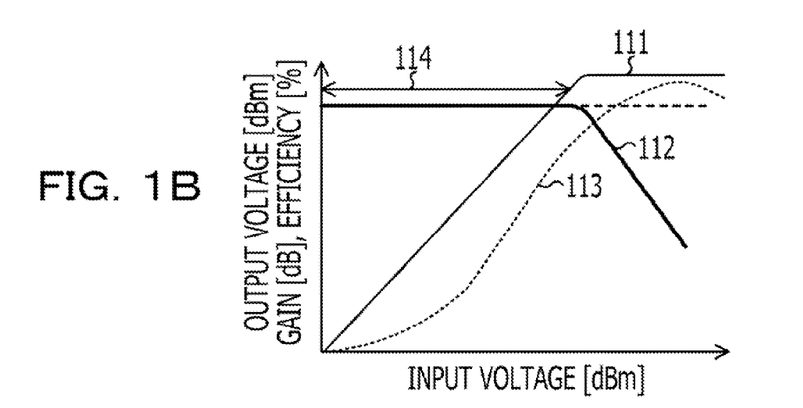
Figure 1C:
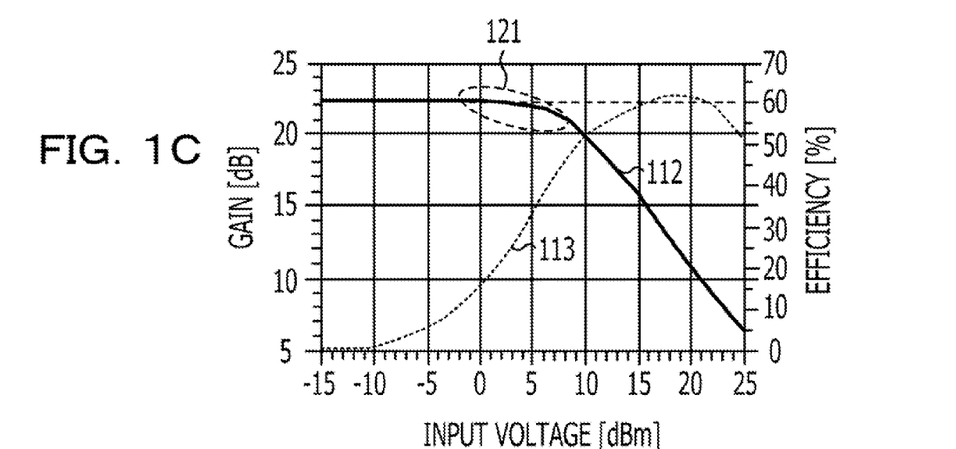

FIGS. 1A to 1C illustrate an amplifier circuit 101 and its characteristics. FIG. 1A illustrates the amplifier circuit 101. The amplifier circuit 101 amplifies an input signal 102 and outputs an output signal 103. FIG. 1B is a graph representing an example of ideal characteristics of the amplifier circuit 101, and FIG. 1C is a graph representing an example of actual characteristics of the amplifier circuit 101. The curve of an output power 111 represents the characteristic of output power versus input power. The curve of a gain 112 represents the characteristic of gain versus input power. The curve of efficiency 113 represents the characteristic of efficiency versus input power. As to the output power 111, a region where the input power is small is a linear operating region 114 and a region where the input power is large is a saturated, nonlinear operating region. The amplifier circuit 101 is required to perform amplification such that the efficiency 113 is high and the output power 111 is linear with respect to the input power. The efficiency 113 increases as the output limitation (saturated output) of the amplifier circuit 101 is approached, and therefore it is desirable that the amplifier circuit 101 operate close to the saturated output. In the actual characteristics in FIG. 1C, however, the slope of the gain 112 of the amplifier circuit 101 gradually becomes smaller in a region 121 close to the saturated output, and, as a result, the gain of the amplifier circuit 101 is decreased and nonlinearity occurs. This poses a problem in that output signals at high powers are distorted.

There is known an amplifier including an amplifying element and a variable matching circuit, the variable matching circuit including at least one variable capacitive element that is provided on at least one of the input side and the output side of the amplifying element and whose electrostatic capacitance is caused to vary by application of a bias voltage.

There is also known a semiconductor circuit that includes a first Wilkinson divider/combiner for splitting and outputting an input signal input from an input terminal, an amplifying element for amplifying outputs of the first Wilkinson divider/combiner, and a second Wilkinson divider/combiner for combining together outputs of the amplifying element and outputting the result as an output signal from an output terminal, and in which variable capacitive elements are coupled to branch points of signal transmission paths in the first and the second Wilkinson divider/combiners.

Examples of the related documents include Japanese Patent Laid-open No. 2008-147730 and International Laid-open Patent Publication No. 2007/096940.

SUMMARY

According to an aspect of the embodiments, a differential amplifier circuit includes a first field effect transistor including a first gate coupled to a first differential input signal terminal, a source coupled to a reference potential node, and a first drain coupled to a first differential output signal terminal, a second field effect transistor including a second gate coupled to a second differential input signal terminal, the source coupled to the reference potential node, and a second drain coupled to a second differential output signal terminal, a first variable capacitor coupled between the first gate of the first field effect transistor and the second drain of the second field effect transistor, a second variable capacitor coupled between the second gate of the second field effect transistor and the first drain of the first field effect transistor, and a first envelope detector configured to detect a first envelope of a signal at the first differential output signal terminal or the second differential output signal terminal, the first variable capacitor and/or the second variable capacitor includes a capacitance that varies in accordance with the first envelope detected by the first envelope detector.

The object and advantages of the invention will be realized and attained by means of at least the features, elements, and combinations particularly pointed out in the claims.

It is to be understood that both the foregoing general description and the following detailed description are exemplary and explanatory and are not restrictive of the invention, as claimed.

DESCRIPTION OF EMBODIMENTS

Example embodiments will be explained with reference to accompanying drawings.

Figure 2A:
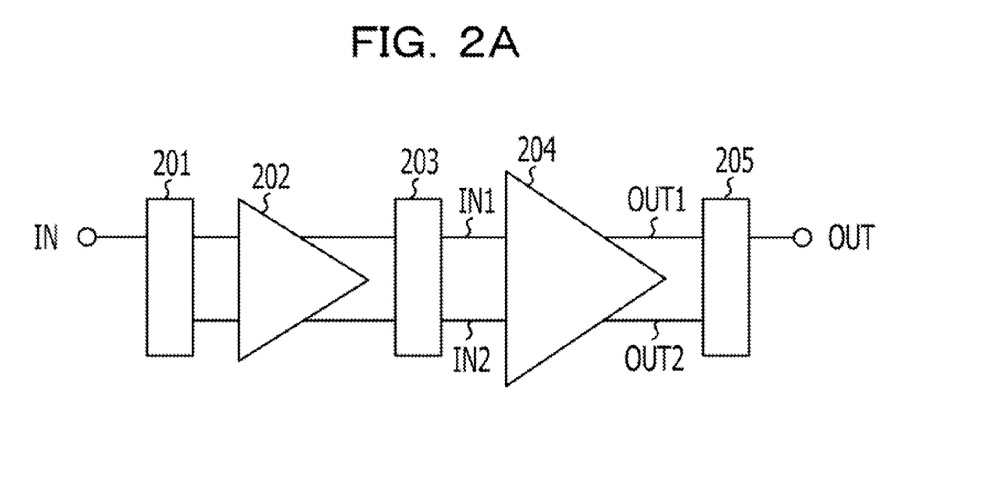
FIG. 2A illustrates differential amplifier circuits at two stages according to a first embodiment.

FIG. 2A illustrates differential amplifier circuits 202 and 204 at two stages according to a first embodiment. The amplifiers illustrated in this figure are power amplifiers for use in, for example, wireless communications devices such as portable terminals. A single-phase signal is input to an input terminal IN and is converted into differential signals by a transformer in a matching circuit 201. The differential amplifier circuit 202 amplifies the differential signals obtained by the conversion and outputs the amplified differential signals through a matching circuit 203 to differential input signal terminals IN1 and IN2. The signals at the differential input signal terminals IN1 and IN2 are differential signals that have opposite phases. A differential amplifier circuit 204 amplifies differential signals input to the differential input signal terminals IN1 and IN2, and outputs the amplified differential signals from differential output signal terminals OUT1 and OUT2. The signals at the differential output signal terminals OUT1 and OUT2 are differential signals that have opposite phases, and are converted into a single-phase signal by a transformer in a matching circuit 205 and output from an output terminal OUT. The matching circuits 201, 203, and 205 are circuits for optimally transmitting the gains of the differential amplifier circuits 202 and 204.

Figure 2B:
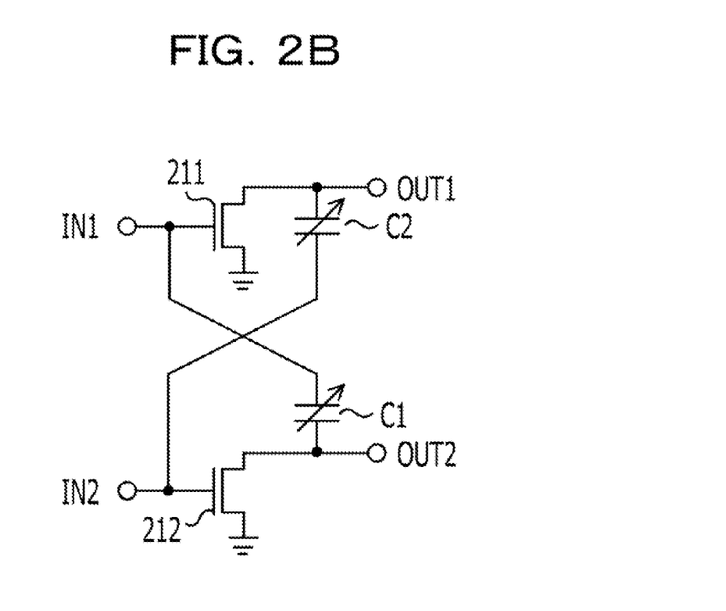
FIG. 2B is a circuit diagram illustrating a configuration example of the differential amplifier circuit.

FIG. 2B is a circuit diagram illustrating a configuration example of the differential amplifier circuit 204. A first field effect transistor 211 is an n-channel field effect transistor whose gate is coupled to the first differential input signal terminal IN1, whose source is coupled to a reference potential node (ground potential node), and whose drain is coupled to the first differential output signal terminal OUT1. A second field effect transistor 212 is an n-channel field effect transistor whose gate is coupled to the second differential input signal terminal IN2, whose source is coupled to a reference potential node, and whose drain is coupled to the second differential output signal terminal OUT2. A first variable capacitor C1 is coupled between the gate of the first field effect transistor 211 and the drain of the second field effect transistor 212. A second variable capacitor C2 is coupled between the gate of the second field effect transistor 212 and the drain of the first field effect transistor 211. By providing the variable capacitors C1 and C2, capacitances between the gates and drains of the field effect transistors 211 and 212 can be cancelled and the gain of the differential amplifier circuit 204 can be increased. Thus, in the differential amplifier circuit 204, the output power relative to the same input power is increased in proportion to the increase in the gain, and therefore the efficiency, which is given by the following equation, can be improved.

Efficiency=(output power-input power)/direct-current power

Figure 3A:
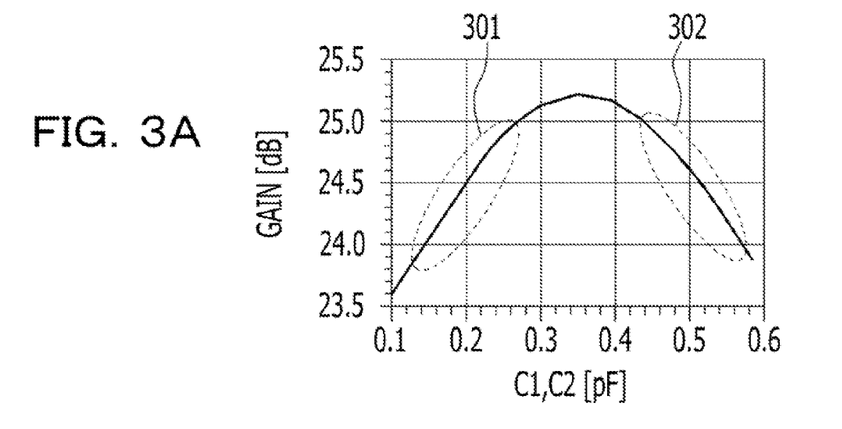
FIGS. 3A and 3B illustrate the relationships between the capacitances of variable capacitors and the gain of the differential amplifier circuit.

FIGS. 3A and 3B illustrate the relationship between the capacitances of the variable capacitors C1 and C2 and the gain of the differential amplifier circuit 204. FIG. 3A is a graph illustrating the relationship between the capacitances of the variable capacitors C1 and C2 and the gain of the differential amplifier circuit 204. In a region 301, the gain of the differential amplifier circuit 204 increases as the capacitances of the variable capacitors C1 and C2 increase. By contrast, in a region 302, the gain of the differential amplifier circuit 204 decreases as the capacitances of the variable capacitors C1 and C2 increase. In this embodiment, the capacitances of the variable capacitors C1 and C2 are controlled by using this characteristic.

Figure 3B:
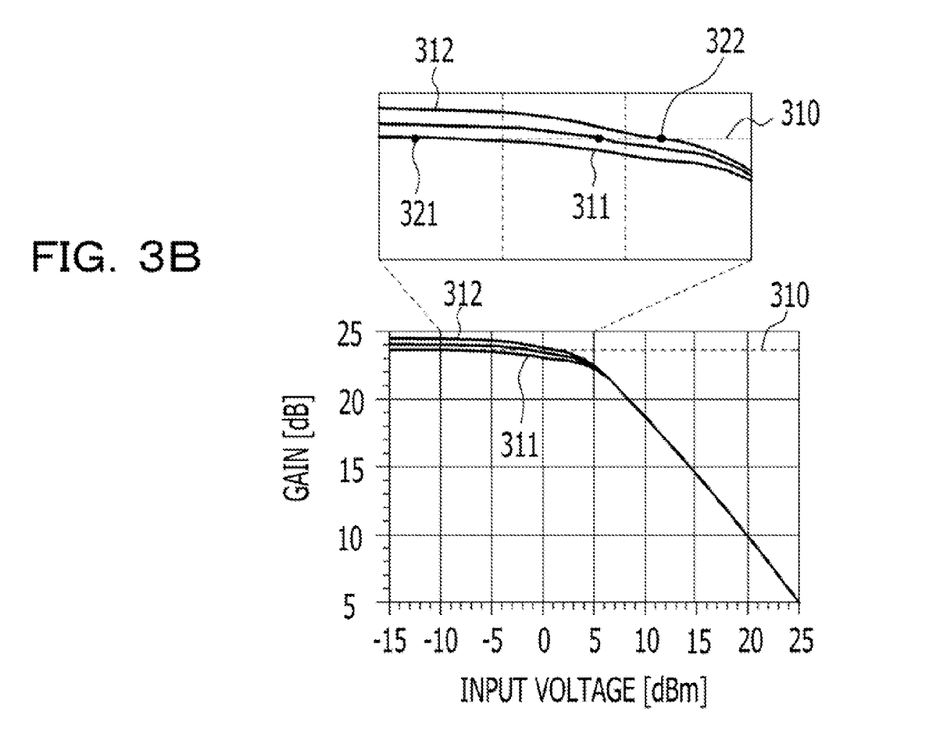

FIG. 3B is a graph illustrating the relationship between the input power and the gain of the differential amplifier circuit 204. A gain 311 is the gain in the case where the capacitances of the variable capacitors C1 and C2 are 0.6 pF. A gain 312 is the gain in the case where the capacitances of the variable capacitors C1 and C2 are 0.5 pF. Based on the characteristic represented in the region 302 of FIG. 3A, the gain 311 is smaller than the gain 312 since the capacitances of the variable capacitors C1 and C2 for the gain 311 are larger than those for the gain 312. In order to maintain a constant gain 310 even if the input power changes, the capacitances of the variable capacitors C1 and C2 are set to 0.6 pF at an input power point 321, so that the gain 311 is equal to the constant gain 310. Further, at an input power point 322, the capacitances of the variable capacitors C1 and C2 are set to 0.5 pF, so that the gain 312 is equal to the constant gain 310. In this way, by setting the capacitances of the variable capacitors C1 and C2 to 0.6 pF (the gain 311) at the input power point 321, where the input power is small, setting the capacitances of the variable capacitors C1 and C2 to 0.5 pF (the gain 312) at the input power point 322, where the input power is large, and, between both, causing the capacitances of the variable capacitors C1 and C2 to gradually vary, the differential amplifier circuit 204 can be maintained at the constant gain 310. That is, the capacitances of the variable capacitors C1 and C2 are set to a relatively large value when the input power is small, and the capacitances of the variable capacitors C1 and C2 are made gradually smaller as the input power increases. In this way, the gain of the differential amplifier circuit 204 is increased with respect to the input power of the region 121 close to the saturated output of the gain 112 of FIG. 1C, so that a constant gain can be maintained and a linear operation area can be enlarged.

Figure 4:
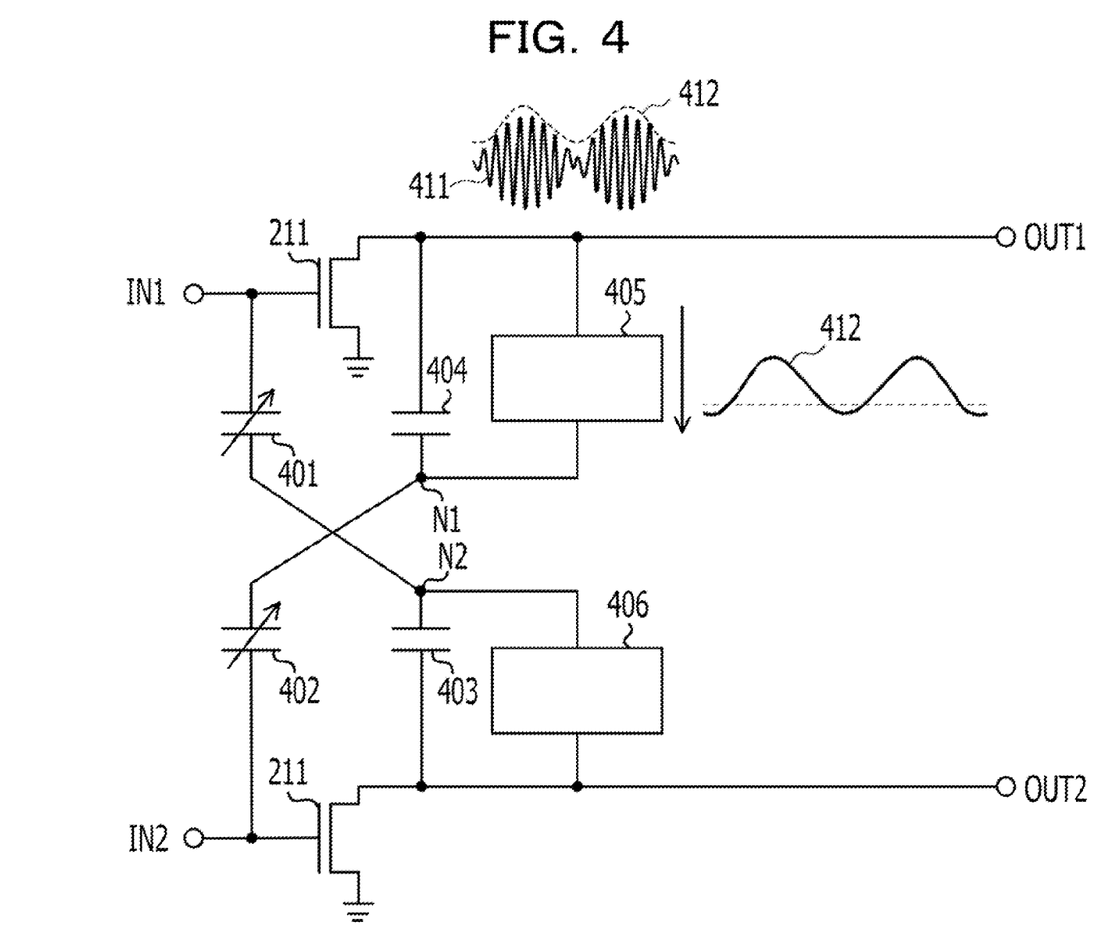
FIG. 4 illustrates a configuration example of the differential amplifier circuit according to the first embodiment.

FIG. 4 illustrates a configuration example of the differential amplifier circuit 204 according to the first embodiment. The first field effect transistor 211 is an n-channel field effect transistor whose gate is coupled to the first differential input signal terminal IN1, whose source is coupled to the reference potential node, and whose drain is coupled to the first differential output signal terminal OUT1. The second field effect transistor 212 is an n-channel field effect transistor whose gate is coupled to the second differential input signal terminal IN2, whose source is coupled to the reference potential node, and whose drain is coupled to the second differential output signal terminal OUT2.

A first variable capacitor 401 is coupled between the gate of the first field effect transistor 211 and a second node N2. A second capacitor 403 is coupled between the second node N2 and the drain of the second field effect transistor 212. A series coupling circuit between the first variable capacitor 401 and the second capacitor 403 corresponds to the first variable capacitor C1 of FIG. 2B and is coupled between the gate of the first field effect transistor 211 and the drain of the second field effect transistor 212.

A second variable capacitor 402 is coupled between the gate of the second field effect transistor 212 and a first node N1. A first capacitor 404 is coupled between the first node N1 and the drain of the first field effect transistor 211. A series coupling circuit of the second variable capacitor 402 and the first capacitor 404 corresponds to the second variable capacitor C2 of FIG. 2B and is coupled between the gate of the second field effect transistor 212 and the drain of the first field effect transistor 211.

A first envelope detector 405 detects an envelope (carrier component) 412 of a signal (modulated wave) 411 at the first differential output signal terminal OUT1 and outputs it to the first node N1. The second variable capacitor 402 has a capacitance that varies in accordance with the voltage of the envelope 412 at the first node N1 detected by the first envelope detector 405.

A second envelope detector 406 detects the envelope of a signal at the second differential output signal terminal OUT2 and outputs it to the second node N2. The first variable capacitor 401 has a capacitance that varies in accordance with the voltage of the envelope at the second node N2 detected by the second envelope detector 406.

A gate bias potential is supplied from the matching circuit 203 of FIG. 2A to the gates of the field effect transistors 211 and 212. A drain bias potential is supplied from the matching circuit 205 of FIG. 2A to the drains of the field effect transistors 211 and 212.

As described above, the capacitances of the variable capacitors 401 and 402 are caused to vary in accordance with the envelopes of signals at the differential output signal terminals OUT1 and OUT2, so that a constant gain can be maintained with respect to the input voltage and a linear operation area can be enlarged as illustrated in FIG. 3B.

Figure 5:
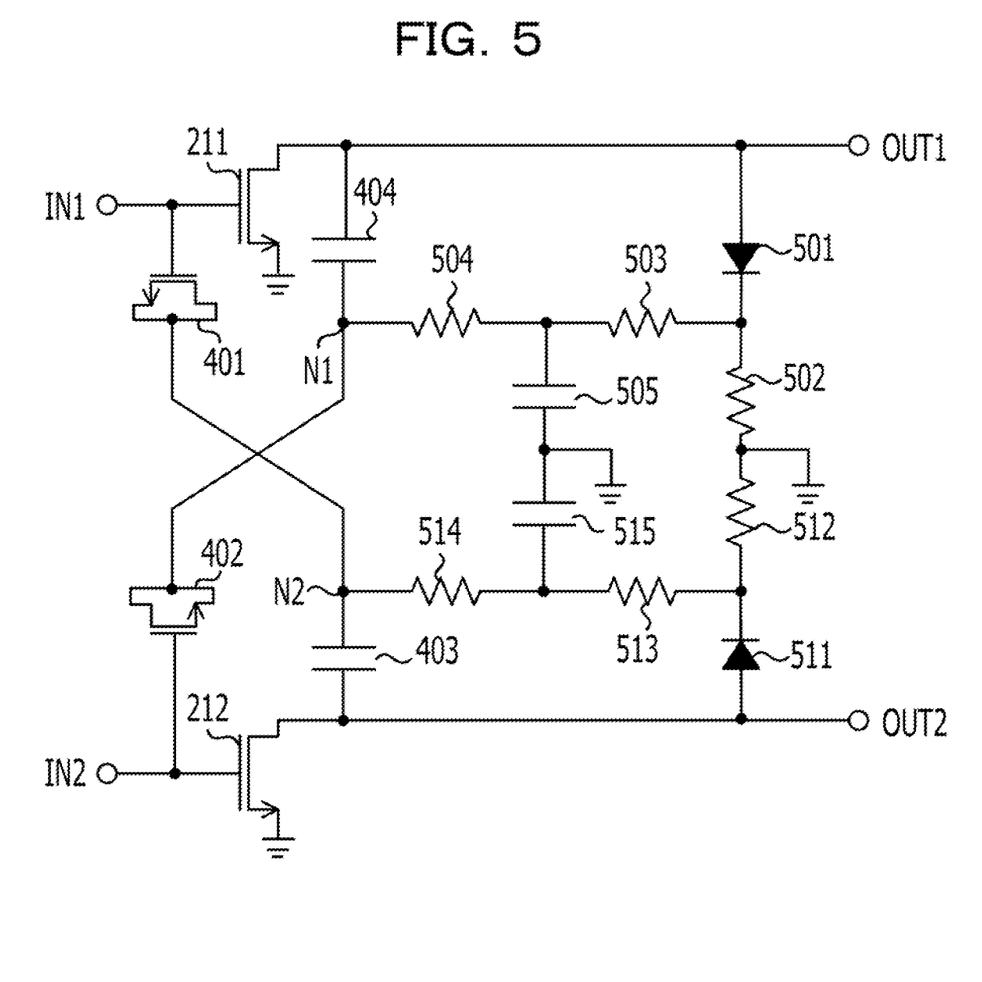
FIG. 5 illustrates a specific configuration example of the variable capacitors and the envelope detectors of FIG. 4.

FIG. 5 illustrates a specific configuration example of the variable capacitors 401 and 402 and the envelope detectors 405 and 406 of FIG. 4. Hereinbelow, points of differences between the circuit of FIG. 5 and the circuit of FIG. 4 will be described. The variable capacitors 401 and 402 are varactor diodes each made of an n-channel field effect transistor. The n-channel field effect transistor, of which the variable capacitor 401 is made, has its gate coupled to the gate of the first field effect transistor 211 and its source and drain coupled to the second node N2. The n-channel field effect transistor, of which the variable capacitor 402 is made, has its gate coupled to the gate of the second field effect transistor 212 and its source and drain coupled to the first node N1.

The first envelope detector 405, which is a nonlinear detector, includes a first diode 501, a first resistor 502, a second resistor 503, a third resistor 504, and a third capacitor 505. The first diode 501 is coupled at the anode to the first differential output signal terminal OUT1. The first resistor 502 is coupled between the cathode of the first diode 501 and a reference potential node. The second resistor 503 is coupled at one end to the cathode of the first diode 501. The third capacitor 505 is coupled between the other end of the second resistor 503 and a reference potential node. The third resistor 504 is coupled between the other end of the second resistor 503 and the first node N1. The resistor 503 and the capacitor 505 together form a low-pass filter.

The second envelope detector 406, which is a nonlinear detector, includes a first diode 511, a first resistor 512, a second resistor 513, a third resistor 514, and a third capacitor 515. The first diode 511 is coupled at the anode to the second differential output signal terminal OUT2. The first resistor 512 is coupled between the cathode of the first diode 511 and the reference potential node. The second resistor 513 is coupled at one end to the cathode of the first diode 511. The third capacitor 515 is coupled between the other end of the second resistor 513 and the reference potential node. The third resistor 514 is coupled between the other end of the second resistor 513 and the second node N2. The resistor 513 and the capacitor 515 together form a low-pass filter.

As described above, varactor diodes using transistors are used as the variable capacitors 401 and 402. The envelope detectors 405 and 406 detect the envelopes (carrier components) of output signals and output the results to the capacitors 401 and 402 of the diodes. Thus, when the input power is equal to or larger than a certain value, the voltages at the nodes N1 and N2 rise as the input power rises. This can decrease the capacitances of the capacitors 401 and 402 of the varactor diodes.

Figure 7:
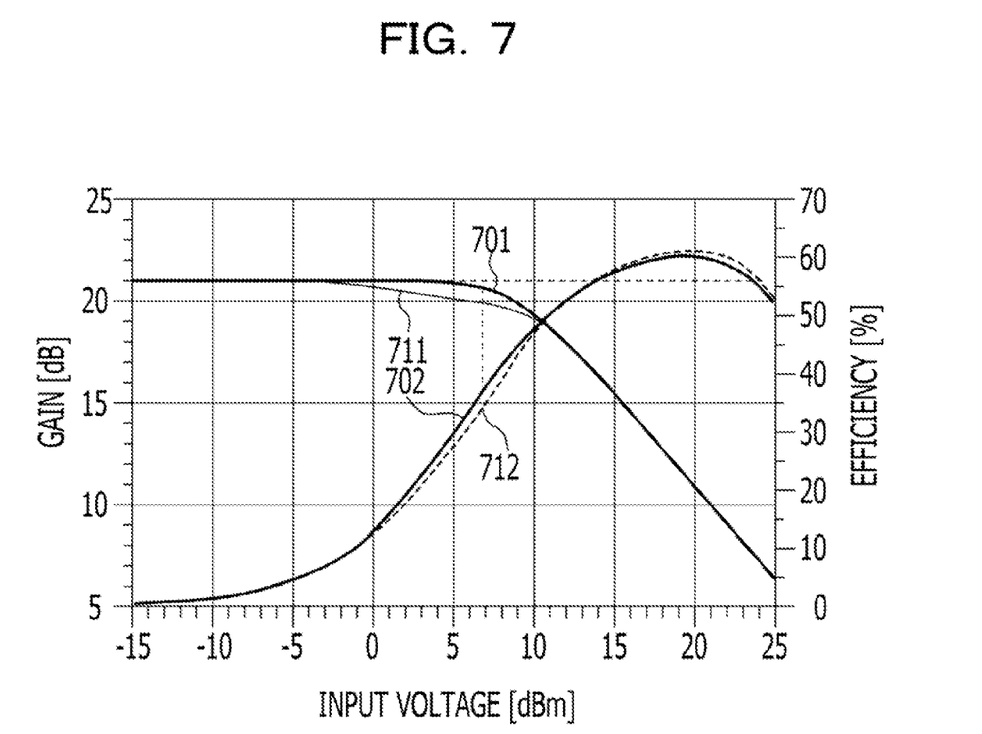
FIG. 7 is a graph illustrating a simulation result of the differential amplifier circuit of FIG. 5.

FIG. 7 is a graph illustrating a simulation result of the differential amplifier circuit 204 of FIG. 5. The curves of gains 701 and 711 represent the characteristics of gain versus input power. The gain 711 represents the gain in the case where the capacitances of the capacitors 401 and 402 are fixed, and the gain 701 represents the gain in the case where the capacitances of the capacitors 401 and 402 are variable in accordance with the voltages at the nodes N1 and N2 as in FIG. 5.

The curves of efficiencies 702 and 712 represent the characteristics of efficiency versus input power. The efficiency 712 represents the efficiency in the case where the capacitances of the capacitors 401 and 402 are fixed, and the efficiency 702 represents the efficiency in the case where the capacitances of the capacitors 401 and 402 are variable in accordance with the voltages at the nodes N1 and N2 as in FIG. 5.

In the case where the capacitances of the capacitors 401 and 402 are fixed, the gain 711 falls and the efficiency 712 deteriorates in a region where the input power is about 0 to 10 dBm. By contrast, in the case where the capacitors 401 and 402 are variable according to this embodiment, the gain 701 is maintained constant and the efficiency 702 exhibits improvement in the region where the input power is about 0 to 10 dBm.

As described above, while the gain 711 appears to gradually come down as the input power rises in the case where the capacitances of the capacitors 401 and 402 are fixed, the linearity of the gain 701 is maintained close to the saturated output and the efficiency 702 is improved in the circuit of this embodiment. In this embodiment, the gain is improved by the use of the variable capacitors 401 and 402, so that the gain 701 can be maintained at a constant value even when the input power increases, the linear operation area can be enlarged, and the efficiency 702 can be improved.

FIGS. 8A to 8H illustrate configuration examples of the second variable capacitor C2 of FIG. 2B. Hereinbelow, a description will be given of the configuration examples of the second variable capacitor C2, to which the configuration examples of the first variable capacitor C1 are similar.

Figure 8A:
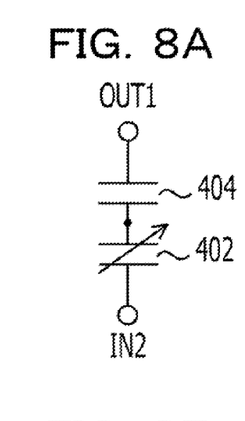
FIGS. 8A to 8H illustrate configuration examples of a second variable capacitor of FIG. 2B.

In FIG. 8A, as in FIG. 4, a series coupling circuit of the first capacitor 404 and the second variable capacitor 402 is coupled between the first differential output signal terminal OUT1 and the second differential input signal terminal IN2.

Figure 8B:
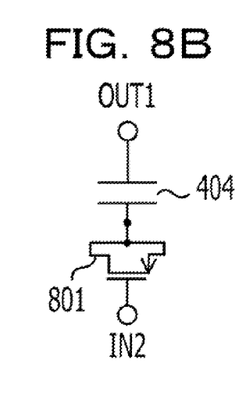

In FIG. 8B, as in FIG. 5, a series coupling circuit of the first capacitor 404 and a second variable capacitor 801 is coupled between the first differential output signal terminal OUT1 and the second differential input signal terminal IN2. The second variable capacitor 801 is a capacitor made of a varactor diode using an n-channel field effect transistor. The n-channel field effect transistor, which is used for the second variable capacitor 801, has its gate coupled to the second differential input signal terminal IN2 and its source and drain coupled to the first capacitor 404.

Figure 8C:
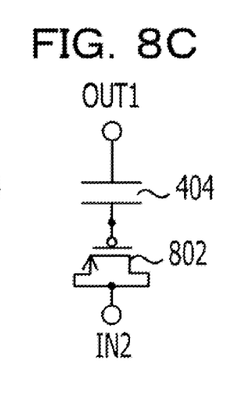

In FIG. 8C, a series coupling circuit of the first capacitor 404 and a second variable capacitor 802 is coupled between the first differential output signal terminal OUT1 and the second differential input signal terminal IN2. The second variable capacitor 802 is a capacitor made of a varactor diode using a p-channel field effect transistor. The p-channel field effect transistor, which is used for the second variable capacitor 802, has its source and drain coupled to the second differential input signal terminal IN2 and its gate coupled to the first capacitor 404.

Figure 8D:
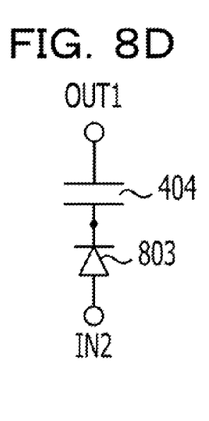

In FIG. 8D, a series coupling circuit of the first capacitor 404 and a second variable capacitor 803 is coupled between the first differential output signal terminal OUT1 and the second differential input signal terminal IN2. The second variable capacitor 803 is a capacitor made of a pn-junction diode. The diode, of which the second variable capacitor 803 is made, is coupled at the anode to the second differential input signal terminal IN2 and is coupled at the cathode to the first capacitor 404.

Figure 8E:
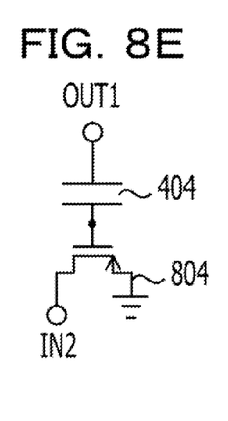

In FIG. 8E, a series coupling circuit of the first capacitor 404 and a second variable capacitor 804 is coupled between the first differential output signal terminal OUT1 and the second differential input signal terminal IN2. The second variable capacitor 804 is a capacitor between the gate and the drain of an n-channel field effect transistor. The n-channel field effect transistor, which is used for the second variable capacitor 804, has its drain coupled to the second differential input signal terminal IN2, its gate coupled to the first capacitor 404, and its source coupled to a reference potential node.

Figure 8F:
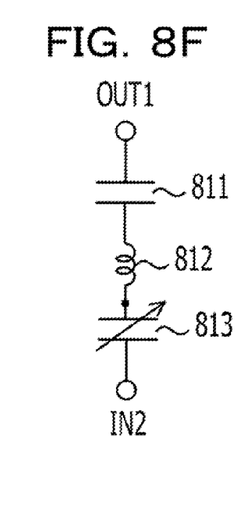

In FIG. 8F, a series coupling circuit of a capacitor 811, an inductor 812, and a variable capacitor 813 is coupled between the first differential output signal terminal OUT1 and the second differential input signal terminal IN2.

Figure 8G:
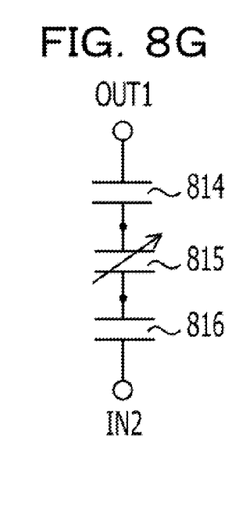

In FIG. 8G, a series coupling circuit of a capacitor 814, a variable capacitor 815, and a capacitor 816 is coupled between the first differential output signal terminal OUT1 and the second differential input signal terminal IN2.

Figure 8H:
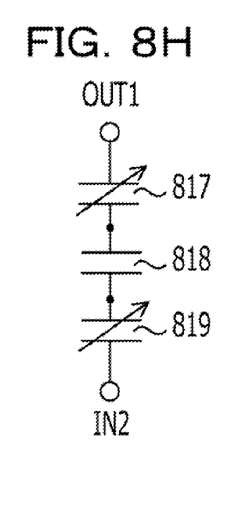

In FIG. 8H, a series coupling circuit of a variable capacitor 817, a capacitor 818, and a variable capacitor 819 is coupled between the first differential output signal terminal OUT1 and the second differential input signal terminal IN2.

In each of the circuits of FIGS. 8A to 8F, the capacitance can be caused to vary by controlling the voltage of one node indicated by a black circle. In each of the circuits of FIGS. 8G and 8H, the capacitance can be caused to vary by controlling the voltages of two nodes indicated by black circles.

Figures 9A, 9B:
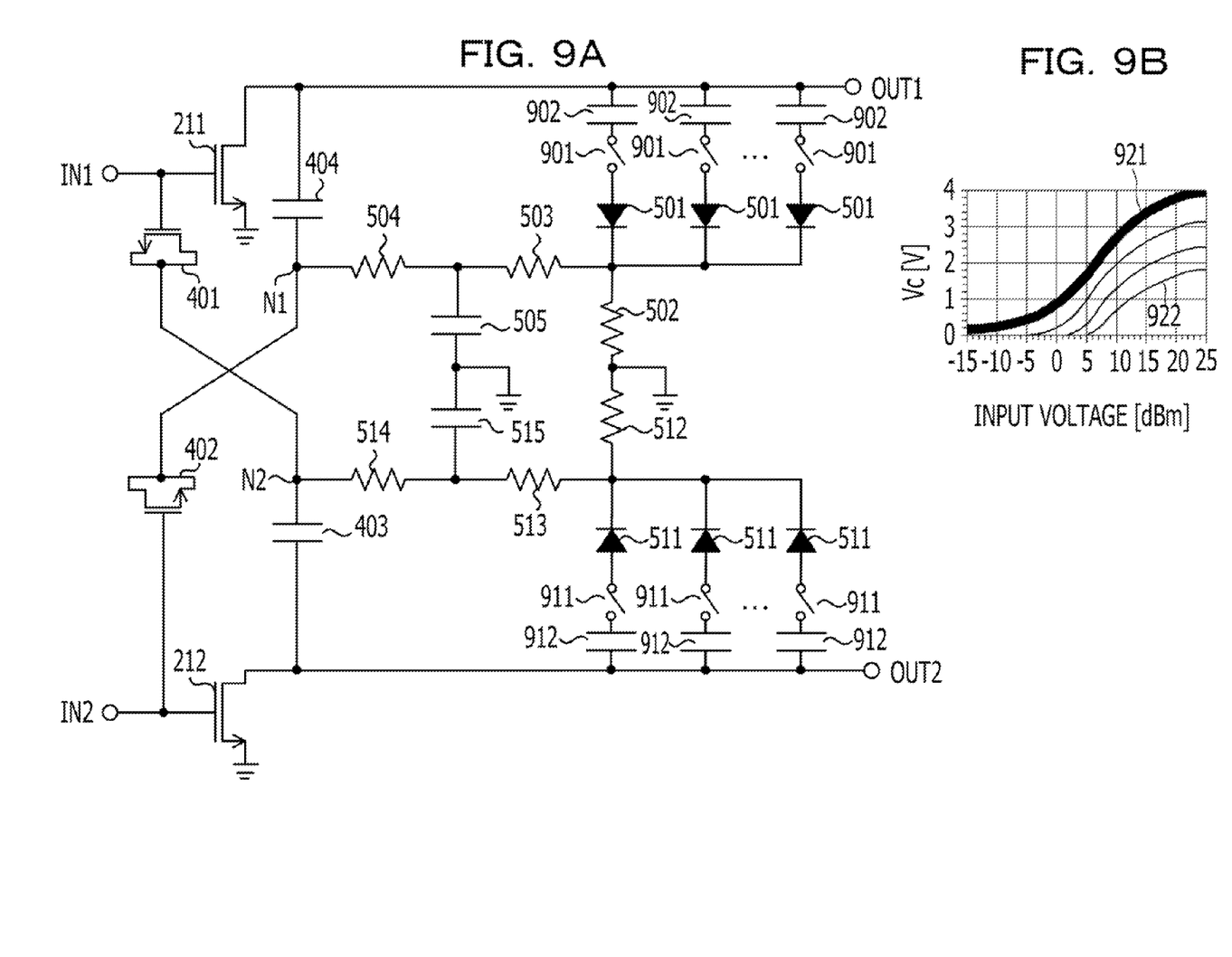
FIG. 9A is a circuit diagram illustrating a configuration example of a differential amplifier circuit according to a second embodiment.
FIG. 9B illustrates a simulation result of the circuit of FIG. 9A.

FIG. 9A is a circuit diagram illustrating a configuration example of the differential amplifier circuit 204 according to a second embodiment, and FIG. 9B illustrates a simulation result of the circuit of FIG. 9A. The circuit of FIG. 9A differs from the circuit of FIG. 5 in that pluralities of first diodes 501 and 511, pluralities of first switches 901 and 911, and pluralities of fourth capacitors 902 and 912 are added in the envelope detectors 405 and 406. Hereinbelow, points of differences between this embodiment and the first embodiment will be described.

The first diode 501 is coupled at the cathode to one end of the second resistor 503 and is coupled at the anode to the first differential output signal terminal OUT1 through the first switch 901 and the fourth capacitor 902. A plurality of series coupling circuits each including the first diode 501, the first switch 901, and the fourth capacitor 902 are coupled in parallel between the first differential output signal terminal OUT1 and one end of the second resistor 503. The larger the number of switches that are turned on among the plurality of switches 901, the larger the number of parallel coupling of the first diodes 501 is and the larger the total size of the first diodes 501 is.

Likewise, the first diode 511 is coupled at the cathode to one end of the second resistor 513 and is coupled at the anode to the second differential output signal terminal OUT2 through the first switch 911 and the fourth capacitor 912. A plurality of series coupling circuits each including the first diode 511, the first switch 911, and the fourth capacitor 912 are coupled in parallel between the second differential output signal terminal OUT2 and one end of the second resistor 513. The larger the number of switches that are turned on among the plurality of switches 911, the larger the number of parallel coupling of the first diodes 511 is and the larger the total size of the first diodes 511 is.

FIG. 9B is a graph illustrating characteristics of a control voltage Vc for the nodes N1 and N2 versus input power. A control voltage 921 is the control voltage Vc in the case where small numbers of switches are turned on among the pluralities of first switches 901 and 911 and the total sizes of the first diodes 501 and 511 are small, and can make small the input power at which the control voltage Vc begins changing. A control voltage 922 is the control voltage Vc in the case where large numbers of switches are turned on among the pluralities of first switches 901 and 911 and the total sizes of the first diodes 501 and 511 are large, and can make large the input power at which the control voltage Vc begins changing.

Switching the total sizes of the first diodes 501 and 511 by using the first switches 901 and 911 allows control of the position at which the control voltage Vc for the nodes N1 and N2 begins changing. Providing the fourth capacitors 902 and 912 enables the capacitors as seen from the differential output signal terminals OUT1 and OUT2 to be constant when any switches 901 and 911 are turned on.

Figure 10A:
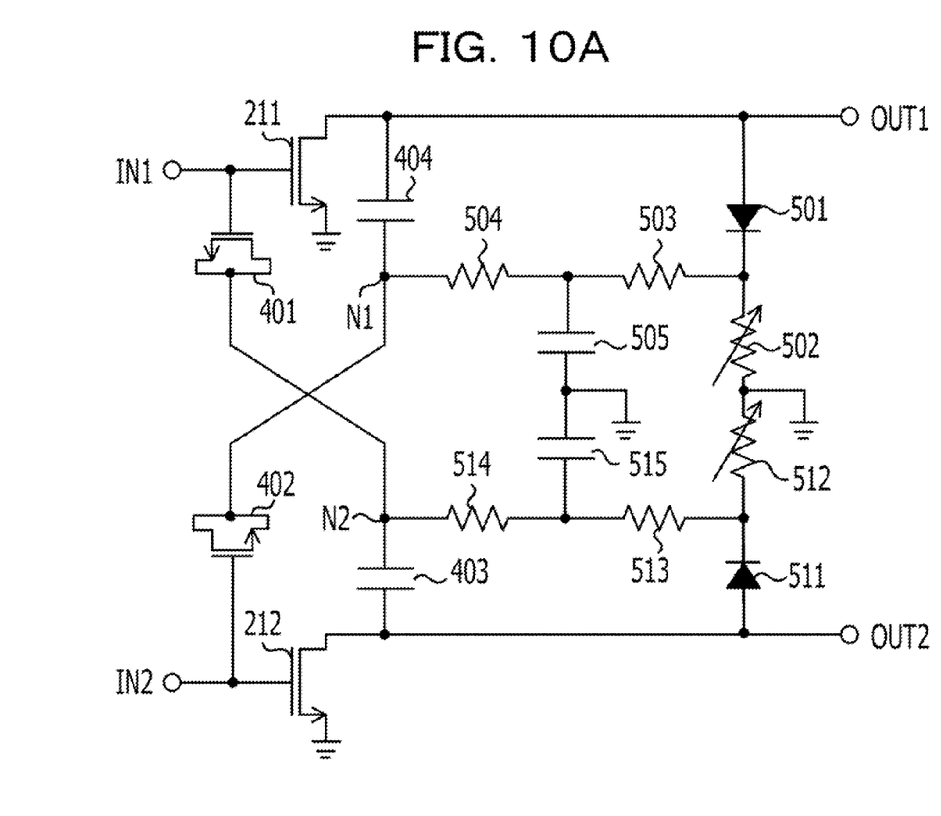
FIG. 10A is a circuit diagram illustrating a configuration example of a differential amplifier circuit according to a third embodiment.
Figure 10B:
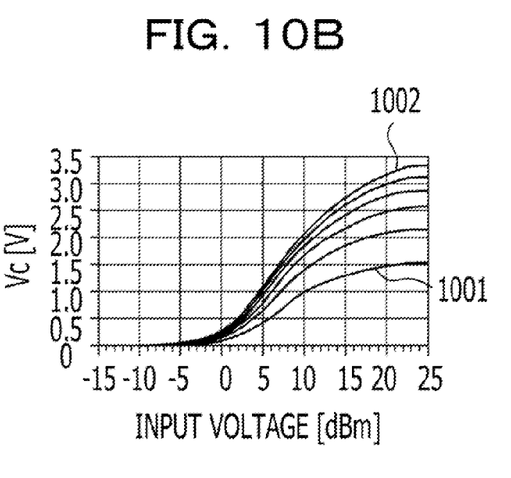
FIG. 10B illustrates a simulation result of the circuit of FIG. 10A.

FIG. 10A is a circuit diagram illustrating a configuration example of the differential amplifier circuit 204 according to a third embodiment, and FIG. 10B illustrates a simulation result of the circuit of FIG. 10A. The circuit of FIG. 10A differs from the circuit of FIG. 5 in that the first resistors 502 and 512 are variable resistors. For other points, this embodiment is the same as the first embodiment.

FIG. 10B is a graph illustrating characteristics of the control voltage Vc for the nodes N1 and N2 versus input power. A control voltage 1001 is the control voltage Vc in the case where the resistances of the first resistors 502 and 512, namely variable resistors, are small, and can make small the amount of change in the control voltage Vc. A control voltage 1002 is the control voltage Vc in the case where the resistances of the first resistors 502 and 512 that are variable resistors are large, and can make large the amount of change in the control voltage Vc. According to this embodiment, the amount of change in the control voltage Vc can be changed by controlling the resistances of the first resistors 502 and 512 that are variable resistors.

Figures 11A, 11B:
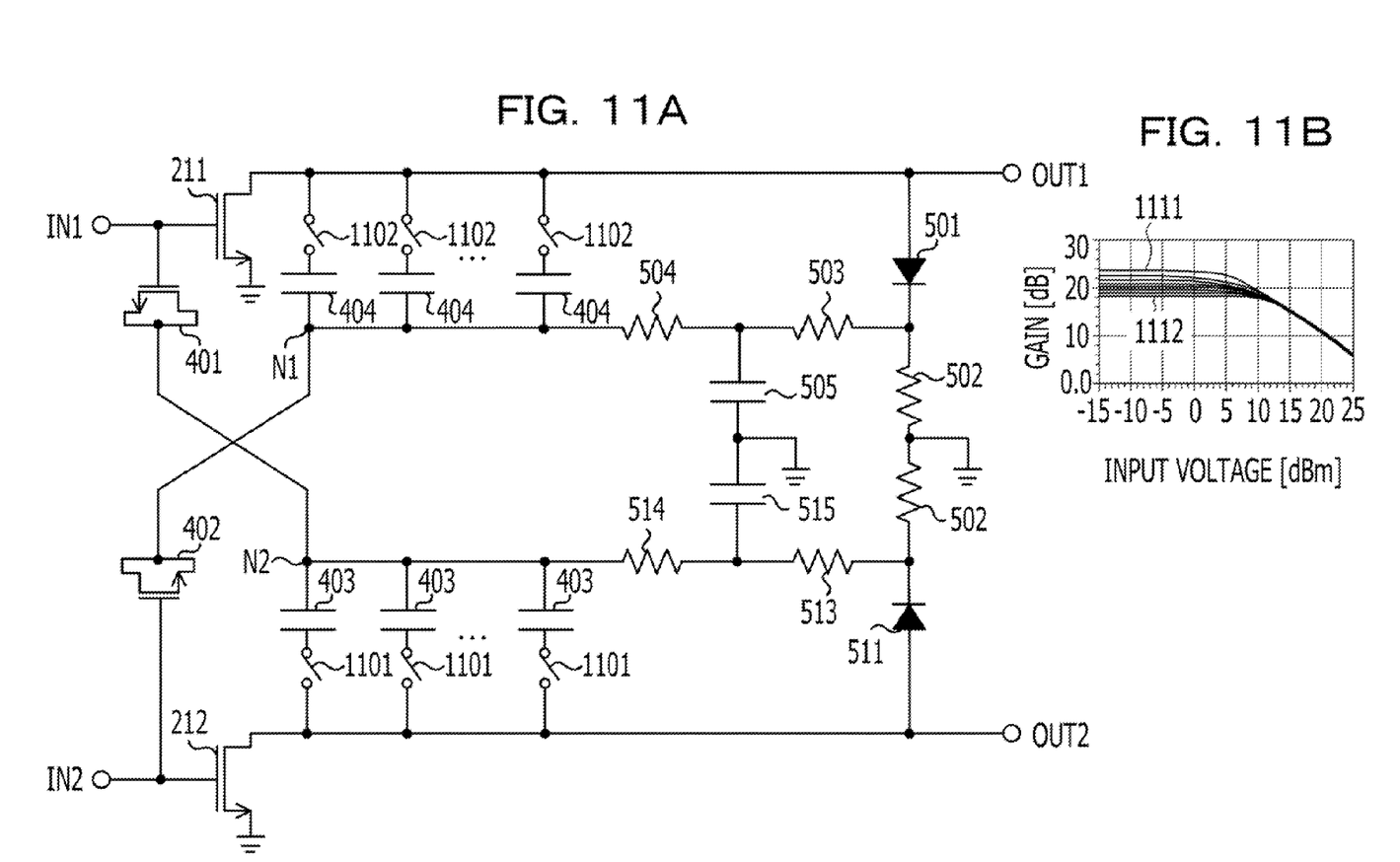
FIG. 11A is a circuit diagram illustrating a configuration example of a differential amplifier circuit according to a fourth embodiment.
FIG. 11B illustrates a simulation result of the circuit of FIG. 11A.

FIG. 11A is a circuit diagram illustrating a configuration example of the differential amplifier circuit 204 according to a fourth embodiment, and FIG. 11B illustrates a simulation result of the circuit of FIG. 11A. The circuit of FIG. 11A differs from the circuit of FIG. 5 in that pluralities of capacitors 403 and 404 and pluralities of switches 1101 and 1102 are added. Hereinbelow, points of differences between this embodiment and the first embodiment will be described.

A plurality of series coupling circuits each including the first capacitor 404 and the second switch 1102 are coupled in parallel between the first node N1 and the drain of the first field effect transistor 211. The larger the number of switches that are turned on among the plurality of second switches 1102, the larger the capacitance of the first capacitors 404 is.

Likewise, a plurality of series coupling circuits each including the second capacitor 403 and the third switch 1101 are coupled in parallel between the second node N2 and the drain of the second field effect transistor 212. The larger the number of switches that are turned on among the plurality of third switches 1101, the larger the capacitance of the second capacitors 403 is.

FIG. 11B is a graph illustrating characteristics of gain versus input power. A gain 1111 is the gain in the case where the numbers of switches that are turned on are small among the pluralities of switches 1101 and 1102, so that the capacitances of the capacitors 403 and 404 are small. This allows the absolute value of the linear gain to be large. A gain 1112 is the gain in the case where the numbers of switches that are turned on are large among the pluralities of switches 1101 and 1102, so that the capacitances of the capacitors 403 and 404 are large. This allows the absolute value of the linear gain to be small. According to this embodiment, the absolute value of the linear gain can be changed by controlling the capacitances of the capacitors 403 and 404.

Figure 12A:
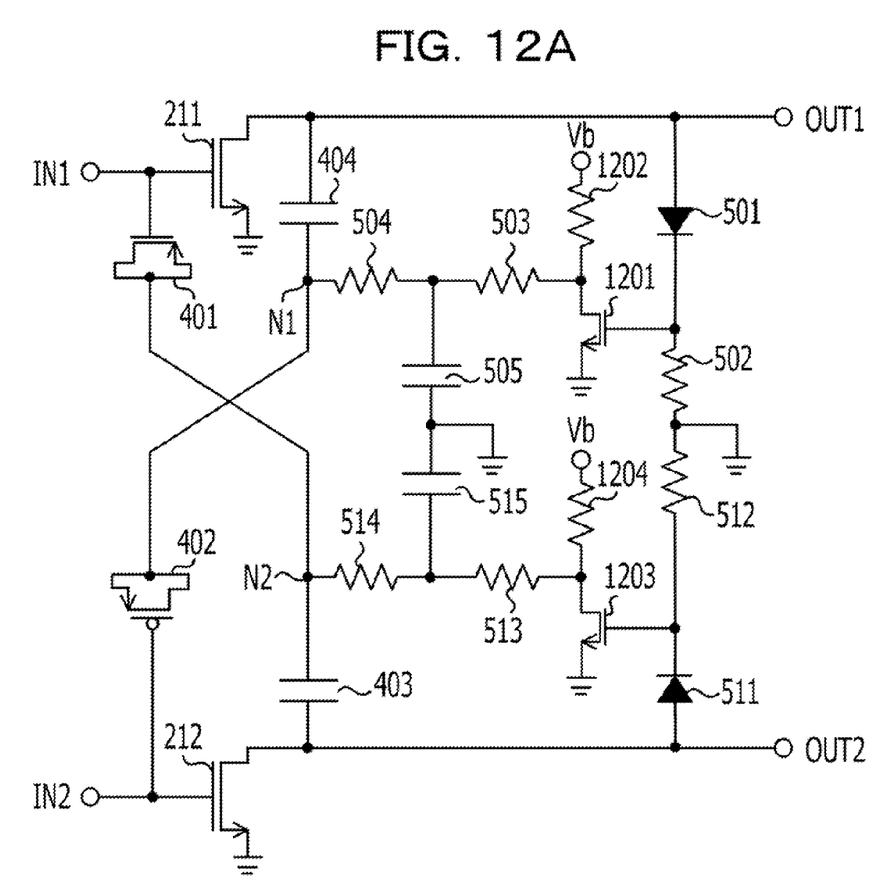
FIG. 12A is a circuit diagram illustrating a configuration example of a differential amplifier circuit according to a fifth embodiment.
Figure 12B:
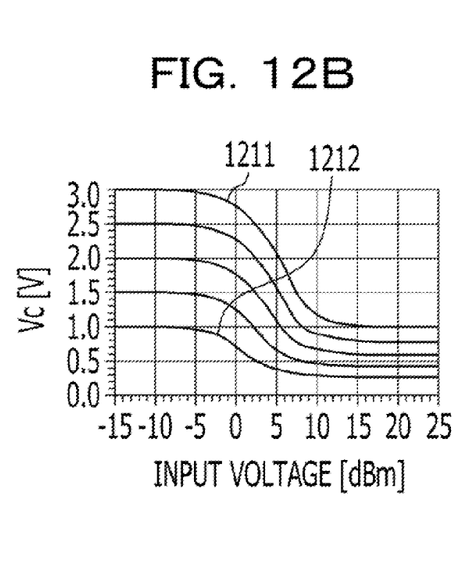
FIG. 12B illustrates a simulation result of the circuit of FIG. 12A.

FIG. 12A is a circuit diagram illustrating a configuration example of the differential amplifier circuit 204 according to a fifth embodiment, and FIG. 12B illustrates a simulation result of the circuit of FIG. 12A. The circuit of FIG. 12A differs from the circuit of FIG. 5 in that third field effect transistors 1201 and 1203 and fourth resistors 1202 and 1204 are added in the envelope detectors 405 and 406. Hereinbelow, points of differences between this embodiment and the first embodiment will be described. The first variable capacitor 401 and the second variable capacitor 402 are made of p-channel field effect transistors as in FIG. 8C.

The third field effect transistor 1201 is an n-channel field effect transistor as an amplifier, and its gate is coupled to the cathode of the first diode 501, its source is coupled to a reference potential node, and its drain is coupled through the fourth resistor 1202 to a bias potential node Vb. One end of the second resistor 503 is coupled to the drain of the third field effect transistor 1201.

Likewise, the third field effect transistor 1203 is an n-channel field effect transistor as an amplifier, and its gate is coupled to the cathode of the first diode 511, its source is coupled to a reference potential node, and its drain is coupled through the fourth resistor 1204 to a bias potential node Vb. One end of the second resistor 513 is coupled to the drain of the third field effect transistor 1203.

FIG. 12B is a graph illustrating characteristics of the control voltage Vc for the nodes N1 and N2 versus input power. A control voltage 1211 is the control voltage Vc in the case where the potential of the bias potential node Vb is 3 V. This case allows the control voltage Vc to be high. A control voltage 1212 is the control voltage Vc in the case where the potential of the bias potential node Vb is 1 V. This case allows the control voltage Vc to be low. This embodiment provides the third field effect transistors 1201 and 1203 as amplifiers in the envelope detectors 405 and 406 in order to substantially prevent the signals of the envelope detectors 405 and 406 from being small because of wiring losses and to control the value of the control voltage Vc.

Figure 6:
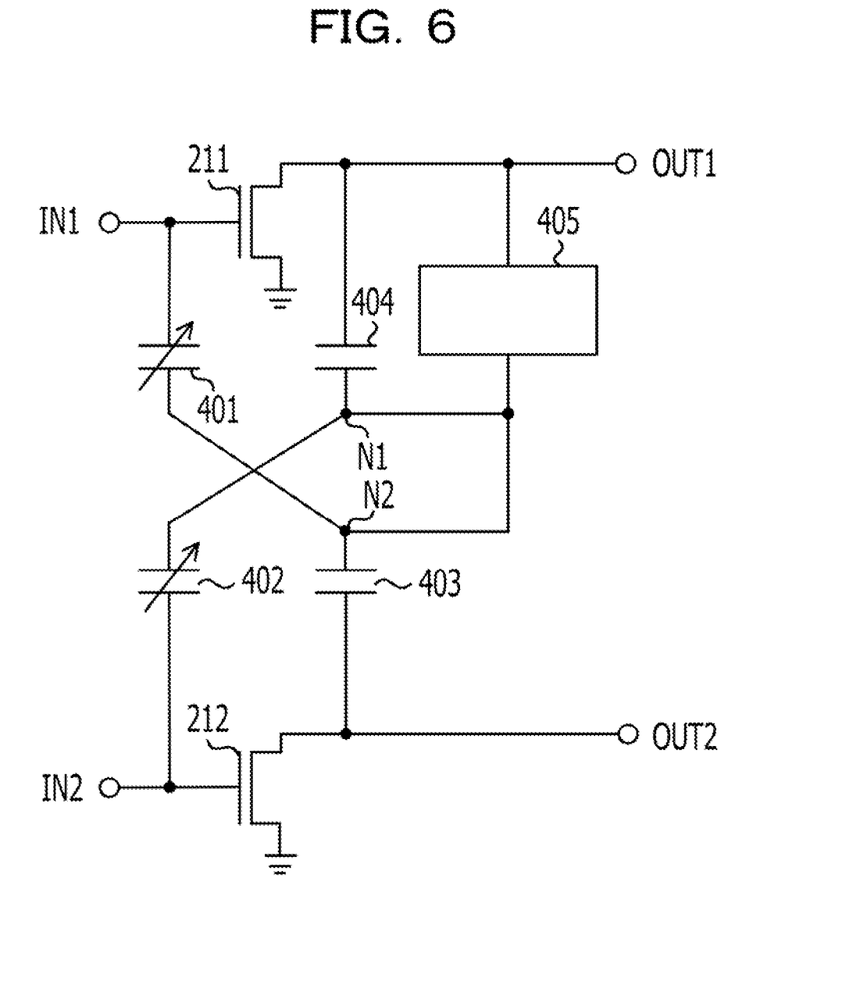
FIG. 6 is a circuit diagram illustrating a configuration example of a differential amplifier circuit according to a sixth embodiment.

FIG. 6 is a circuit diagram illustrating a configuration example of the differential amplifier circuit 204 according to a sixth embodiment. The circuit of FIG. 6 differs from the circuit of FIG. 4 in that the second envelope detector 406 is removed. Hereinbelow, points of differences between this embodiment and the first embodiment will be described. The output terminal of the first envelope detector 405 is coupled to the second node N2 as well as the first node N1 and outputs the detected envelope 412 to the first node N1 and the second node N2. Specifically, the circuit of FIG. 6 differs from the circuit of FIG. 4 in that the second envelope detector 406 is removed and the first node N1 and the second node N2 are coupled to each other. This embodiment uses the first envelope detector 405 of FIG. 6 commonly for the functions of the first envelope detector 405 and the second envelope detector 406 of FIG. 4. The first envelope detector 405 is configured to detect the envelope of a signal of the first differential output signal terminal OUT1, and the second envelope detector 406 is configured to detect the envelope of a signal of the second differential output signal terminal OUT2. The signal at the first differential output signal terminal OUT1 and the signal at the second differential output signal terminal OUT2 are differential signals that have opposite phases. Accordingly, as illustrated in FIG. 4, the envelope 412 detected by the first envelope detector 405 and the envelope 412 detected by the second envelope detector 406 are the same. Accordingly, in the case where the first envelope detector 405 outputs the envelope 412 to the first node N1 and the second node N2 as in this embodiment, substantially the same effect as in the first embodiment is obtained.

It is to be noted that while the case in which the second envelope detector 406 of the circuit of FIG. 4 is removed is exemplarily described, the first envelope detector 405 of the circuit of FIG. 4 may be similarly removed in this embodiment such that the second envelope detector 406 outputs the envelope to the first node N1 and the second node N2. In this embodiment, the capacitances of the first variable capacitor 401 and the second variable capacitor 402 vary in accordance with an envelope detected by either the first envelope detector 405 or the second envelope detector 406.

According to the first to sixth embodiments, causing the capacitances of the first variable capacitor C1 and the second variable capacitor C2 to vary in accordance with an envelope detected by the first envelope detector 405 and/or the second envelope detector 406, so that the gain with respect to the input power can be maintained constant and the linear operating region can be enlarged.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. A differential amplifier circuit comprising:
a first field effect transistor including a first gate coupled to a first differential input signal terminal, a source coupled to a reference potential node, and a first drain coupled to a first differential output signal terminal;
a second field effect transistor including a second gate coupled to a second differential input signal terminal, the source coupled to the reference potential node, and a second drain coupled to a second differential output signal terminal;
a first variable capacitor coupled between the first gate of the first field effect transistor and the second drain of the second field effect transistor;
a second variable capacitor coupled between the second gate of the second field effect transistor and the first drain of the first field effect transistor; and
a first envelope detector configured to detect a first envelope of a signal at the first differential output signal terminal or the second differential output signal terminal,
the first variable capacitor and/or the second variable capacitor includes a capacitance that varies in accordance with the first envelope detected by the first envelope detector.

2. The differential amplifier circuit according to claim 1, further comprising a second envelope detector configured to detect a second envelope of a signal at the second differential output signal terminal,
wherein the first envelope detector detects the envelope of a signal at the first differential output signal terminal, the first variable capacitor includes a capacitance that varies in accordance with the second envelope detected by the second envelope detector, and the second variable capacitor includes a capacitance that varies in accordance with the first envelope detected by the first envelope detector.

3. The differential amplifier circuit according to claim 1, further comprising:

a first capacitor coupled in series with the second variable capacitor; and a second capacitor coupled in series with the first variable capacitor, wherein a series coupling circuit of the first variable capacitor and the second capacitor is coupled between the first gate of the first field effect transistor and the second drain of the second field effect transistor, and a series coupling circuit of the second variable capacitor and the first capacitor is coupled between the gate of the second field effect transistor and the drain of the first field effect transistor.

4. The differential amplifier circuit according to claim 1, wherein the first envelope detector includes a first diode coupled at an anode to the first or the second differential output signal terminal, a first resistor coupled between a first cathode of the first diode and the reference potential node, a second resistor coupled at one end to the first cathode of the first diode, a third capacitor coupled between the other end of the second resistor and the reference potential node, and a third resistor coupled between the other end of the second resistor and the first or the second variable capacitor.

5. The differential amplifier circuit according to claim 4, further comprising a first switch and a fourth capacitor coupled in series to the first diode, wherein a plurality of series coupling circuits each including the first diode, the first switch, and the fourth capacitor are coupled in parallel between the first or the second differential output signal terminal and one end of the second resistor.

6. The differential amplifier circuit according to claim 4, wherein the first resistor is a variable resistor.

7. The differential amplifier circuit according to claim 4, further comprising:

a first capacitor and a second switch coupled in series with the second variable capacitor; and a second capacitor and a third switch coupled in series with the first variable capacitor, wherein a plurality of series coupling circuits each including the first capacitor and the second switch are coupled in parallel between the second variable capacitor and the first drain of the first field effect transistor, and a plurality of series coupling circuits each including the second capacitor and the third switch are coupled in parallel between the first variable capacitor and the second drain of the second field effect transistor.

8. The differential amplifier circuit according to claim 4, wherein the first envelope detector includes a third field effect transistor, the third field effect transistor including a third gate coupled to the first cathode of the first diode, the source coupled to a reference potential node, and a third drain coupled through a fourth resistor to a bias potential node, and one end of the second resistor is coupled to the third drain of the third field effect transistor.

\* \* \* \* \*